United States Patent [19]
Conway et al.

[11] Patent Number: 5,087,537
[45] Date of Patent: Feb. 11, 1992

[54] LITHOGRAPHY IMAGING TOOL AND RELATED PHOTOLITHOGRAPHIC PROCESSES

[75] Inventors: John F. Conway, Sterling; Edward C. Fredericks, Manassas; Giorgio G. Via, McLean, all of Va.

[73] Assignee: International Business Machines Corporation, Armonk, N.Y.

[21] Appl. No.: 419,860

[22] Filed: Oct. 11, 1989

[51] Int. Cl.⁵ .................................................. G03C 3/00
[52] U.S. Cl. ........................................ 430/15; 430/22; 430/30; 430/13; 430/14; 430/312; 430/327; 250/491.1; 250/492.1; 250/492.2; 250/492.3; 437/8; 437/27
[58] Field of Search .............. 250/491.1, 492.1, 492.2, 250/492.3; 437/8, 27; 430/312, 327, 30, 22, 13, 14, 15

[56] References Cited

U.S. PATENT DOCUMENTS

| | | |
|---|---|---|
| 4,370,554 | 1/1983 | Bohlen et al. |
| 4,413,186 | 11/1983 | Uema ........................ 250/491.1 |
| 4,564,764 | 1/1986 | Yasuda et al. |
| 4,568,189 | 2/1986 | Bass et al. |
| 4,590,382 | 5/1986 | Tabata ......................... 250/491.1 |
| 4,757,207 | 7/1988 | Chappelow et al. ........ 250/491.1 |

FOREIGN PATENT DOCUMENTS 0170013 6/1985 United Kingdom .

OTHER PUBLICATIONS

Behringer et al., "IBM Technical Disclosure Bulletin", vol. 26, No. 12, May 1984, Lithographic Registration Pattern.

Rottmann et al., IBM Technical Disclosure Bulletin, 1984, "Method for Lithographic Tool and Process Characterization".

Primary Examiner—Charles L. Bowers, Jr.
Assistant Examiner—Thomas R. Neville
Attorney, Agent, or Firm—Jeffrey S. LaBaw

[57] ABSTRACT

An apparatus and method for characterizing lithography imaging to quickly optimize a lithography process is described. The apparatus consists of two lithography masks for use with an optical stepper, ion-beam or x-ray lithography tool. The first mask is used for creating topography on the wafer substrate, and is patterned with groups of large elements arranged in orthogonal and angular directions. The second mask is used for defining a periodic pattern over the large elements. Preferably, the periodic pattern is in the same order of dimension as the critical element on the integrated circuit. A method is provided for characterizing lithography tools which do not have lithography masks such as an electron beam exposure tool.

18 Claims, 9 Drawing Sheets

LITHOGRAPHY IMAGING TOOL AND RELATED PHOTOLITHOGRAPHIC PROCESSES

BACKGROUND OF THE INVENTION

1. Technical Field

This invention relates generally to an apparatus used in fabricating integrated circuits where a mask pattern is lithographically transferred onto a substrate such as a semiconductor wafer. More particularly, it relates to an apparatus and method for characterizing an lithography imaging tool and related photolithographic processes.

2. Background Art

Integrated circuits in semiconductor technology continue to decrease in size to increase the density of circuits and their switching speed. As the circuits grow more complex, so do the processes developed to manufacture them. Current lithography processes define patterns on the semiconductor wafer of one micron and even submicron dimensions. The topography, the variations in height on the substrate, over which these fine line circuits must be fabricated becomes an increasingly severe problem at submicron dimensions. The production of these highly integrated monolithic circuits typically involves the transfer of patterns from a lithographic mask onto a photoresist covered wafer through the use of optical, electron beam, ion beam or x-ray imaging tools. Due to resolution requirements of some fine line structures of the circuits, some process steps may only be accomplished through the use of electron beam, ion beam or x-ray lithography. On other levels the elements of the circuit may be relatively large, and hence, more suitable for optical lithography. On still other levels, different types of lithography tools may be used interchangeably. A typical semiconductor wafer lot may undergo ten or more imaging or photolithographic steps at different times in the manufacturing process upon different tools.

This situation creates a number of potential problems. As a variety of imaging tools may be used on successive levels of a semiconductor wafer, it becomes more difficult to assure good overlay registration and line widths between the various tools. To possess the capability of transferring a particular photolithography step from tool to tool in a separate photolithography process must be developed for each tool. Both the tool characteristics such as exposure time, resolution, depth of field, illumination, uniformity, and the photoresist process characteristics such as the best resist system, resist thickness, resist sensitivity, developer, resist contrast, development time and temperature, etc. will differ from tool to tool and level to level of the wafer. To complicate matters further, not only do photolithography tools of different types and from different manufacturers behave differently, but so do photolithography tools from the same manufacturer and of the same model, having small, but possibly catastrophic, differences in lens systems and radiation sources. As an advanced lithography tool can represent a multi-million dollar investment, the choice of a tool unsuitable for the lithography process can be an expensive mistake.

In the past, process engineers have generally used product type masks to determine whether a particular lithography tool can perform a particular lithography step and to develop the process for the particular level. However, the requirements of the product masks, e.g., functional circuits, do not produce circuit patterns which are ideally suited for testing lens systems. A product mask set is not designed to provide the lithography process engineer maximum information to diagnose which of the many possible variables caused the failure to adequately image the critical elements. The elements which are critical to manufacturing success are often scattered over the chip site, rather than uniformly distributed over the chip, creating a number of "blind spots" where it is difficult to determine that the lithography tool would accurately transfer a critical element in that position in the mask pattern onto the substrate. In addition to "blind spots", product masks generally have elements oriented in X- and Y-directions only. Many lens defects are difficult to identify without an additional angular element to help separate the X and Y contributions to the image transfer anomalies. Further, it is expensive to design product masks; it is possible that an engineer might wish to study a process for finer elements for future use than is required for the current integrated circuits, but could not have a mask in hand to do so.

SUMMARY OF THE INVENTION

It is therefore an object of the present invention to efficiently characterize a photolithography tool for a given photolithography process performed on a substrate.

It is another object of the present invention to optimize alignment between different types of photolithography tools in an expeditious manner.

It is yet another object of the present invention to optimize photolithography process parameters using a minimum of resources.

It is still another object of the present invention to optimize photolithographic processes over severe topology.

It is still yet another object of the present invention to track process maintainability and tool degradation over time.

It is yet a further object of the present invention to evaluate photolithographic materials performance.

These and other objects of the invention are accomplished by a specially designed apparatus and method for its use, the apparatus preferably comprising two masks for use with a lithographic imaging tool. The apparatus, when used with a imaging tool, distributes a uniform pattern of elements over a selected area of a photoresist covered substrate. The elements are arranged in groups of at least three elements each, the groups including individual elements oriented in both orthogonal and angular directions with respect to one another. The area selected by the process engineer to study may be a single chip site, several chip sites across the substrate, or most likely, the entire substrate area.

The first mask, called a topography creating mask, has a repetitious pattern of relatively large elements such as rectangles in groups arranged of at least three rectangles each with individual rectangles oriented in orthogonal and angular directions. Subsequently, semiconductor processing is used to create topography on a substrate such as a semiconductor wafer using the topography creating mask pattern. For example, the pattern provided by the topography creating mask can be etched into the wafer to simulate topography resulting from a large via. Alternatively, the pattern can be used to provide a mesa structure on the wafer surface through lift-off processes to simulate topography resulting from a metal line. The second mask, called a periodicity definition mask, defines a repetitious pattern of periodic sets of fine elements such as lines in a second photoresist applied layer over the substrate surface once topography has been created. These periodic sets of lines are arranged in groups of at least three sets each with individual periodic sets of lines oriented in orthogonal and angular directions. The fine elements are preferably sized to be on the same order of the critical elements in the lithography process which is to be optimized. When the second mask is superimposed on the first mask, the fine elements overlay the larger elements of the first mask. The sets of fine elements in the periodicity definition mask are preferably arranged in subsets of fine elements of progressively decreasing width separated by spaces of progressively decreasing width.

Once the fine elements are developed in the second photoresist layer, the wafer can be studied via a scanning electron microscope (SEM) for pattern definition and resist height. Because the fine elements are distributed uniformly over the selected area, any point within that area can be chosen for study, and any anomaly in the lens system which prevents accurate transfer of the critical element at that point is readily discovered.

BRIEF DESCRIPTION OF THE DRAWINGS

The foregoing and other advantages of the invention will be more fully appreciated with reference to the accompanying figures.

DETAILED DESCRIPTION OF THE DRAWINGS

Figure 1:
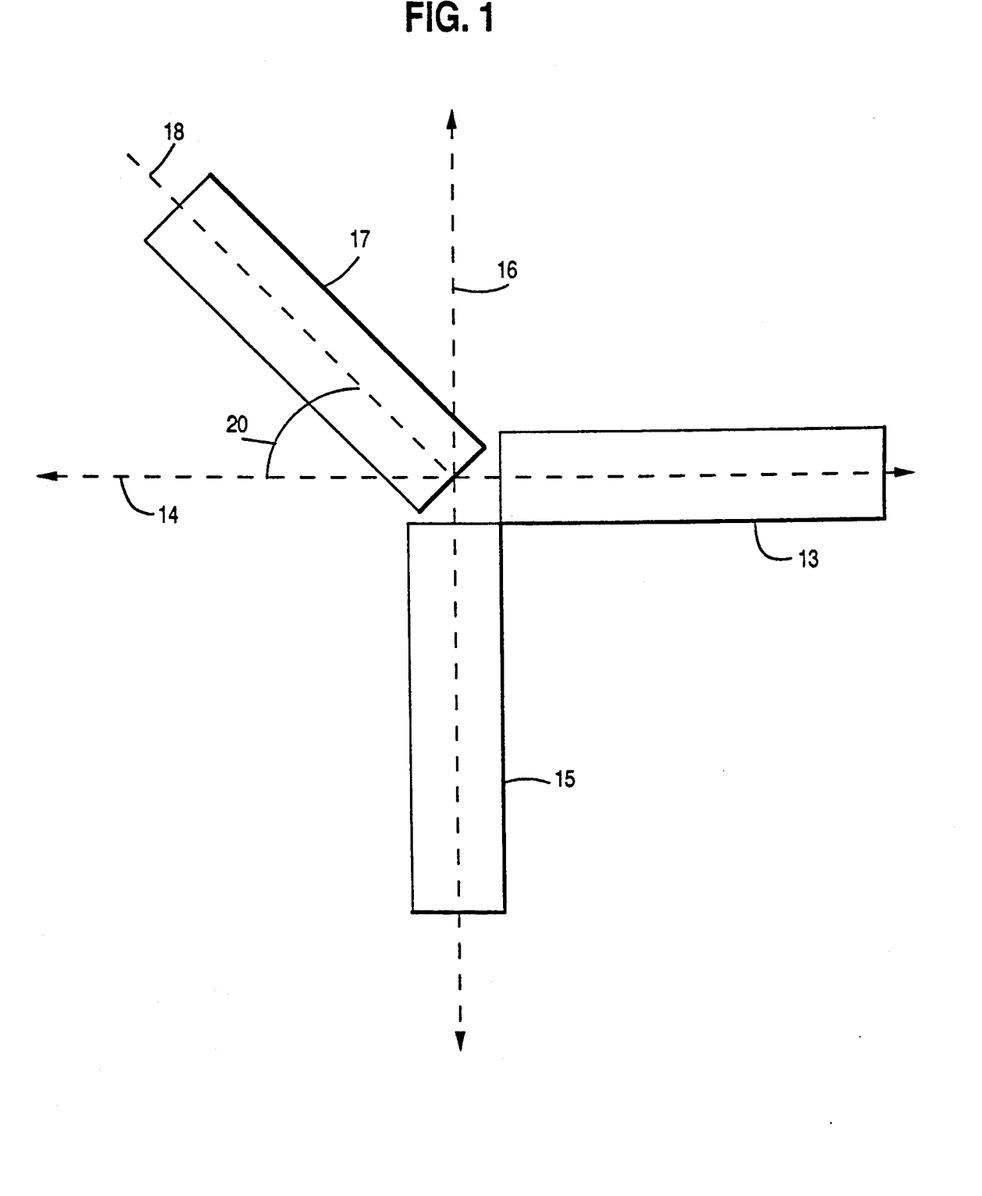
FIG. 1 is a representation of a top view of a single group of large elements on the topography creating mask designed according to, the present invention.

Referring to FIG. 1, a top view representation of a single group of large elements on the topography creating mask is portrayed. While the lithographic masks used with the various types of imaging tools vary somewhat in construction, in general, they are made from a substrate material transparent to the radiation wavelengths emitted by the tool coated with a material opaque to the radiation. The opaque material is patterned to allow the radiation through the mask in predetermined geometries. For example, in FIG. 1, each group of large elements consists of at least three elements preferably rectangular in form. For a positive resist, each of the rectangles would be transparent to the radiation emitted by the lithography tool, and would be surrounded by opaque material deposited in the field areas. For a negative resist, the rectangles would be opaque and the field areas transparent.

In FIG. 1, the first large element 13 positioned so that its long axis is substantially parallel to the x-direction 14, the second large element 15 positioned so that its long axis is positioned substantially parallel to the y-direction 16 and the third large element 17 positioned so that its long axis is substantially parallel to line 18, drawn at an angle from the x-direction 14 not equal to 90 degrees. Ideally, this angle 20 is equal to 45 degrees, since the elements exposed along this line will have equal X and Y components. As shown in FIG. 1, one end of each of the rectangles is positioned in close proximity the ends of the other two rectangles to form a Y shape. These elements could be merged into a single Y, or a right angle and a rectangle. Those skilled in the art would consider either the single Y or the right angle and rectangle designs to consist of three elements oriented in orthogonal and angular direction and to be obvious equivalents to the preferred embodiment.

Figure 2:
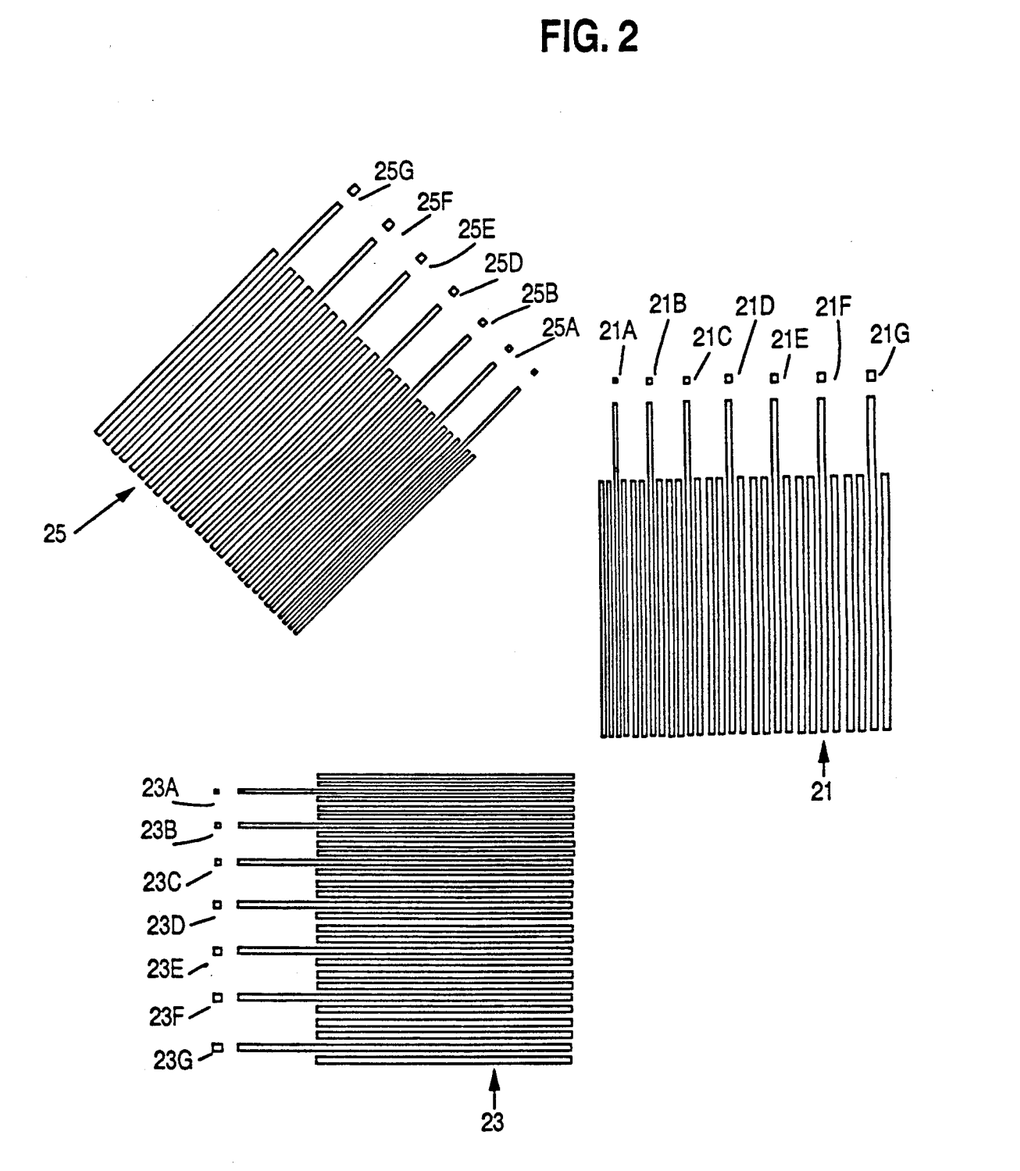
FIG. 2 is a representation of a top view of a single group of fine elements on the periodicity definition mask designed according to the present invention.

Referring to FIG. 2, a top view representation of a single group of fine elements in the periodicity definition mask is portrayed. The fine elements are grouped in three sets 21, 23 and 25 which correspond to the large elements 13, 15 and 17 of the topography creating mask in FIG. 1. In the preferred embodiment, each set of fine elements is arranged in a periodic pattern of subsets of parallel lines of equal width arranged from smallest width in the center of the group to an increasing width at the periphery of the group. Preferably, the widths and spaces of the lines in the various subsets of the periodicity definition mask are selected to be on the same order as the line width of the critical element in the integrated circuit to be optimized. For example, if the critical element in a lithography process is a 1 micron line, the four parallel lines in subset 21A would measure 0.4 micron in width, each separated by a 0.4 micron space; the four parallel lines in subset 21B would measure 0.6 micron in width, each separated with a 0.6 micron space; in the subset 21C four parallel lines each would measure 0.8 micron in width, separated with a 0.8 micron space; the lines in subset 21D would measure 1 micron in width, each separated with a 1 micron space, and so forth, up to subset 21G, each line being of 1.6 micron in width, separated by a 1.6 micron space. Preferably, the same periodic pattern is repeated in all three sets of fine elements 21, 23 and 25.

While the periodic pattern of the periodicity definition mask need not have lines which range an equal amount smaller than the critical element as lines that range larger than the critical element, it is desirable to bracket the critical element within the range of line widths. Nor do the lines of each subset have to be separated by spaces equal to the line width; in the example above, subset 21A could have four parallel lines of 0.4 micron in width separated by spaces of 0.5 micron and so on. Another element of the preferred embodiment is that in the periodicity defining mask one line of each subset is longer than the other lines in the subset. This allows the process engineer to conduct a comparison of the proximity effects of densely packed lines versus the proximity effects in lines in isolated areas. Similarly, at the end of each of the longer lines of a subset, a square of the same width as the line is positioned to study via or stud definition at the particular line width.

Figure 3:
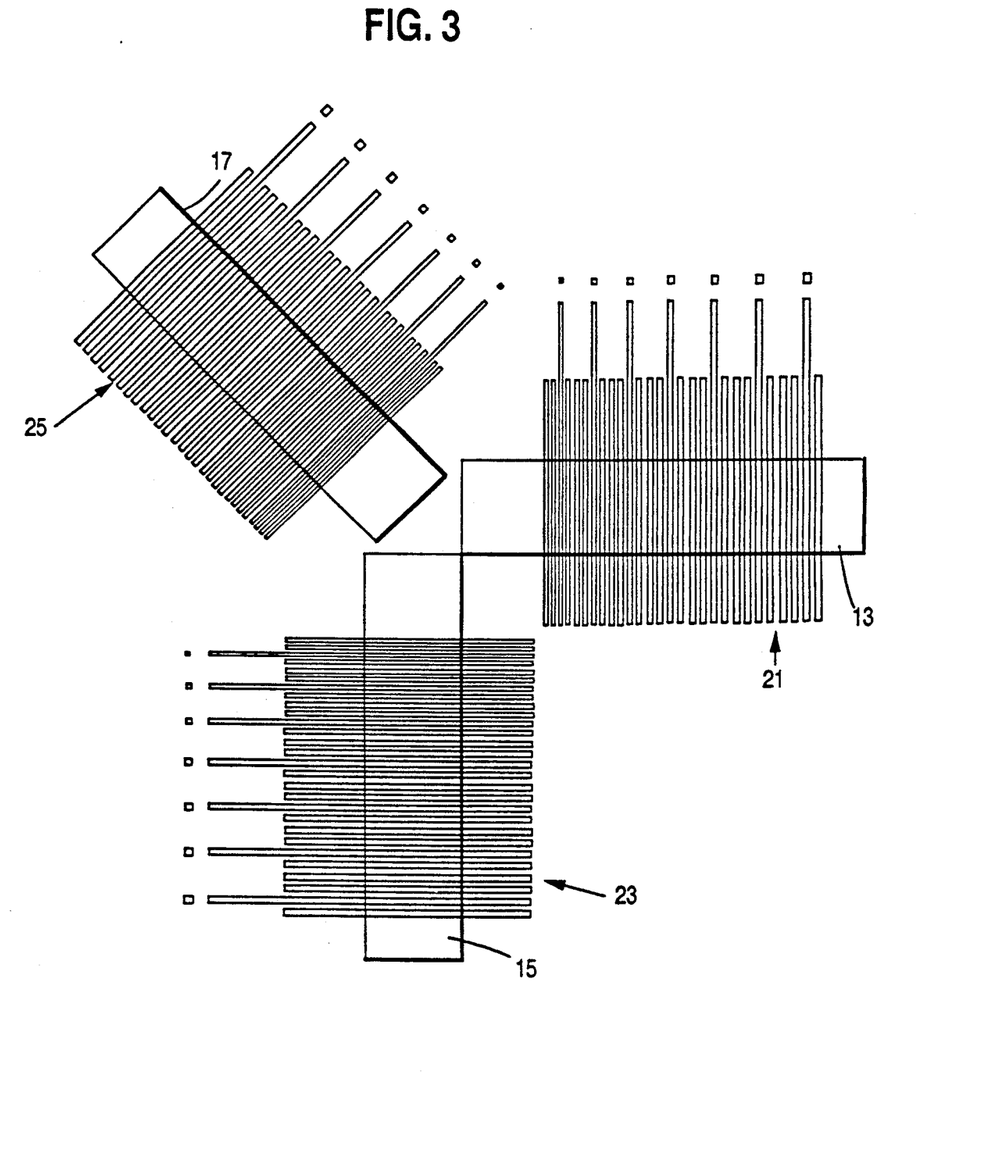
FIG. 3 is a representation of a top view of the single group of fine elements of the periodicity definition mask of FIG. 2 overlaying the single group of large elements on the topography creating mask of FIG. 1.

Referring to FIG. 3, the fine elements of a periodicity definition mask have been overlayed on the large elements of the topography creating mask. The fine elements of the first set 21 overlay the first rectangle 13, both of which are positioned in a direction substantially parallel to the x-direction. The second set of fine elements 23 is positioned over the second rectangle 15, both of which are positioned in a direction parallel to the y-direction. The third set of fine elements 25 is positioned over the third rectangle 17, both of which are positioned at an angle 45 degrees from the x-direction. Each of the lines in the periodic pattern of fine elements is orthogonal to the line which the entire set is positioned along. Each line is longer than the underlying rectangles are wide to enable the process designer to determine the depth of focus of the particular lithography tool. Depth of focus can be determined by comparing the lines on top of the large elements and those outside the large elements since the portions of the lines inside the rectangle will be at a different height from those portions of the lines outside the rectangle once topography is created. Also, as mentioned above, the thinnest lines are arranged towards the center of the group because of their greater sensitivity to defects in the lens system of the lithography tool and the effects of reflection, exposure and intensity, and the desire to simulate a single point as accurately as possible.

Figure 4:
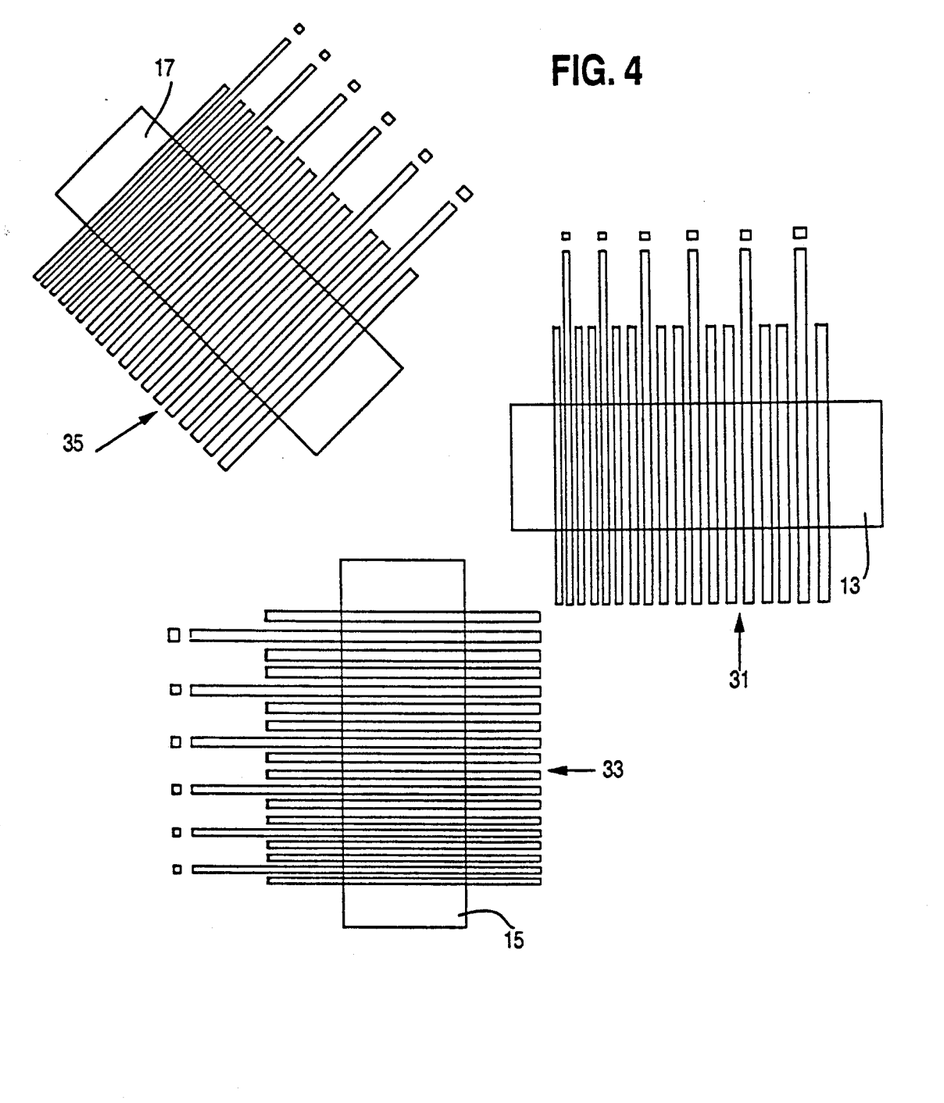
FIG. 4 is a representation of a top view of a second group of fine elements of a second periodicity definition mask overlaying the single group of large elements on the topography creating mask of FIG. 1.

FIG. 4 depicts a second periodicity definition mask, with a group of larger fine elements in sets 31, 33, 35 than the first periodicity definition mask depicted in FIGS. 2 and 3, overlaying the group of large rectangles 13, 15, 17 of the topography creating mask of FIG. 1. In this periodicity definition mask, there are three lines of equal width in each subset, rather than four in the previous mask, and the lines vary from 1 micron to 3 microns in width to optimize a lithography process where 2 micron elements are required. In FIG. 4, sets of fine elements 33 and 35 are oriented with the thinnest lines away from the center of the group which would tend to be less advantageous for measuring lithography tool parameters as discussed above.

Figure 5:
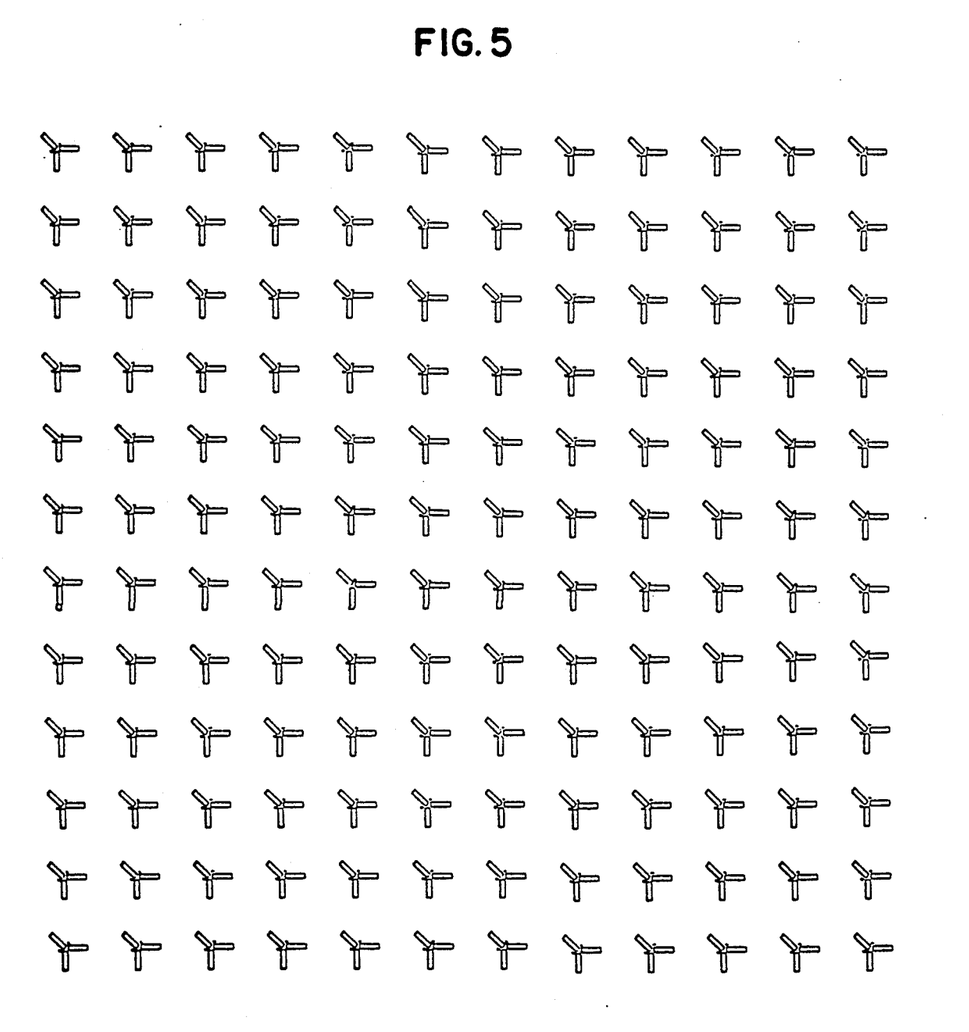
FIG. 5 is a representation of a top view of a 12 by 12 array of groups of large elements on the topography creating mask.

FIG. 5 is a representation of a top view of a 12 by 12 array of groups of large elements on a topography creating mask such as that which might be used in an optical stepper. This pattern would be repeated across the wafer until each chip site on the wafer was patterned or for whatever area the engineer had selected. Repeating the pattern across the wafer simulates the actual manufacturing process where many integrated circuit chips are produced from a single wafer. The array pattern actually used is likely to be larger than the 12 by 12 array pattern shown in FIG. 5, particularly when large product chips are to be emulated.

Figure 6:
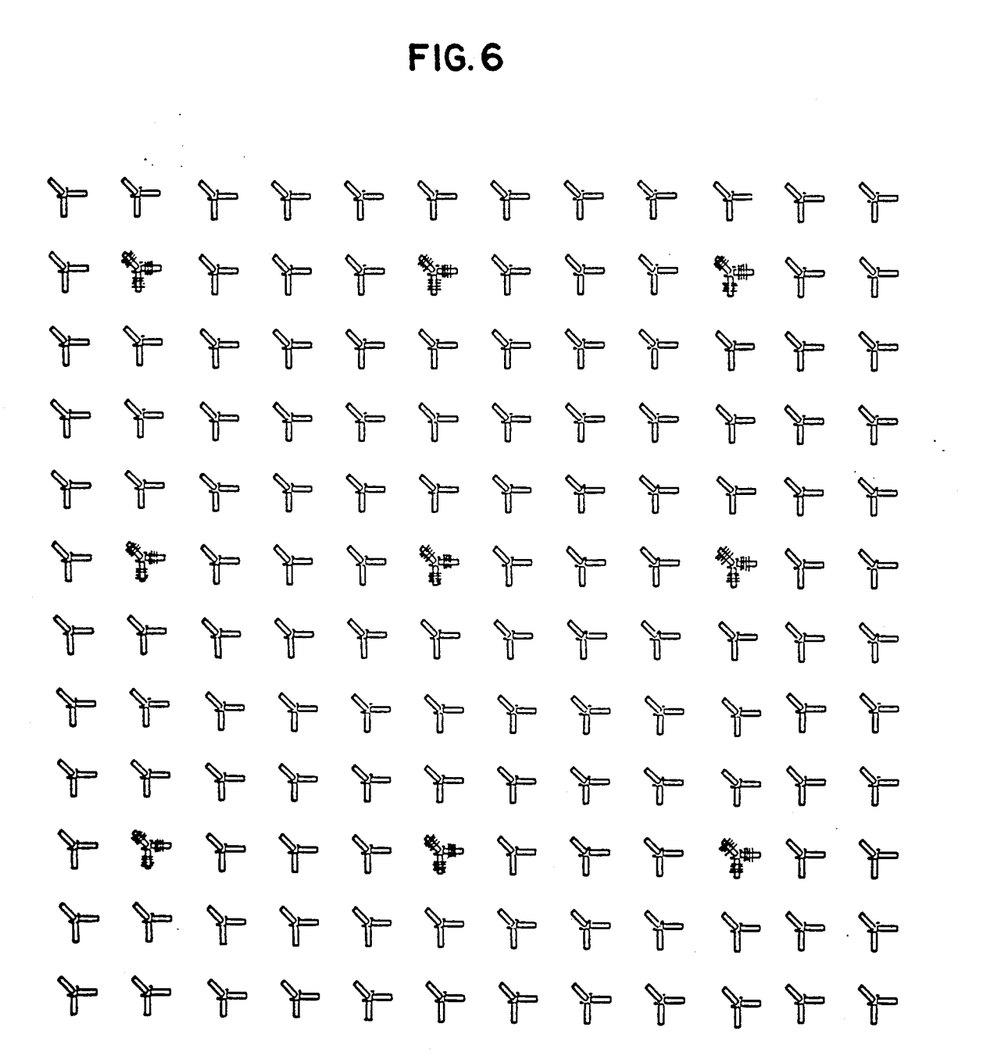
FIG. 6 is a representation of a top view of a 12 by 12 array of groups of large elements on the topography creating mask with three selected groups overlayed with groups of fine elements of a periodicity definition mask.

FIG. 6 shows a 12 by 12 array pattern of the topography creating mask overlayed with a sparsely populated periodicity definition mask. This represents one embodiment of a general case where there are an unequal number of groups of the large elements on the topography creating mask and groups of the fine elements on the periodicity definition mask. In FIG. 6, there are far more groups of large elements than small elements. However, in an alternate embodiment, the situation could be reversed so that only a selected few of a large number of fine element groups are overlayed on topography created by a few groups of large elements. By placing some groups of the fine elements in the periodic pattern on the large elements of the topography creating mask side by side with other fine elements which are placed on a flat wafer surface, the depth of field and effects of substrate reflection can be studied. In this way, the effects of chemically grown surfaces, etched surfaces or implanted surfaces on fine line lithographic patterns can be studied as such surfaces may differ greatly in reflectivity from planar wafer surfaces.

Figure 7:
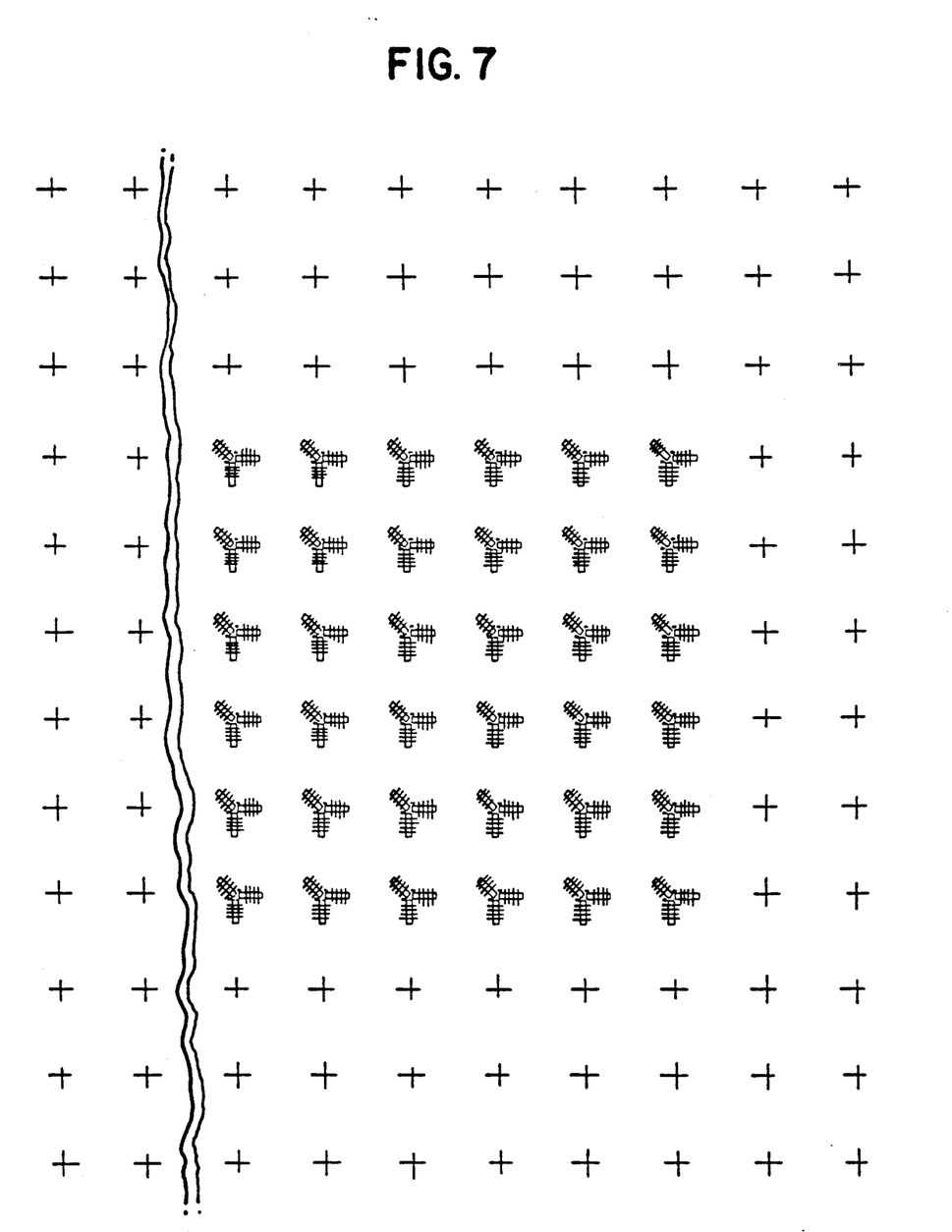
FIG. 7 is a representation of a top view of a 12 by 12 array of groups of large elements on the topography creating mask with all groups overlayed with groups of fine elements of a periodicity definition mask.

FIG. 7 shows a 12 by 12 array pattern where each group of large elements on a topography creating mask is overlaid with a group of fine elements from the periodicity definition mask. The process engineer can utilize the two masks of the present invention to accomplish a variety of purposes. The present invention is superior to the use of product mask patterns to optimize a lithography process. By uniformly distributing groups of fine elements representative of a critical element over the selected area of the substrate, there are no "blind spots" where an imaging tool anomaly might lie hidden. Nor must the process engineer hunt through a mask pattern to find the critical element which could occur in but a few places on the product wafer. A quick process check is provided by the present invention. If the fine elements on the periodicity definition mask which correspond in width to the critical element can not be resolved; the purchase of an unsuitable tool can be avoided, or an indication is provided that the current tooling is inadequate to the task. If the critical elements overlay a substrate with severe topography, comparing the fine elements at the highest and lowest elevations left by the topography creating mask determine whether the depth of focus is adequate.

Once it appears that the lithography tool and resist system are adequate for the given lithography step, fine tuning the tool by changing the focus or exposure time across the wafer on the individual chip sites or fine tuning the resist system by varying the thickness of resist or development time on individual wafers in the job lot, can quickly optimize the best working point. Reflective notching over topography can also be studied and optimized. Notching is a narrowing of the resist line over a step due to increased reflectivity caused by the step and can degrade device performance. It may be found that a multilayer resist process needs to be implemented to planarize the topography and make imaging easier.

A great deal of information can be collected using the present invention concerning the uniformity of various process parameters such as resist uniformity, etch uniformity, developer temperature, lot-to-lot resist uniformity, exposure wavelength and illumination uniformity both within chip and chip-to-chip because of the number of groups of fine elements available for examination. Even more information on an equal number of wafers can be collected where an experimental matrix is formed on each wafer. For example, one process parameter, such as exposure time, can be varied across a given wafer in the horizontal direction, and a second process parameter, such as focus, is varied in the vertical direction across the wafer. Each wafer in the experiment would have a slightly different resist system or developer temperature, thus allowing the process engineer to study the effects of a wide variety of parameters with relatively few resources.

Much of the information obtained by the present invention is found on the periodicity definition mask. Consequently, if depth of focus information is not required, for instance, if the best focus has already been determined for the particular tool and level, or the resist layer is applied to relatively modest topography or planarized substrate surface, it is possible to use the periodicity definition mask alone.

FIGS. 8A-8E depict cross section views of a portion of a wafer undergoing the process according to the present invention for optimizing a lithography process.

Figure 8A:
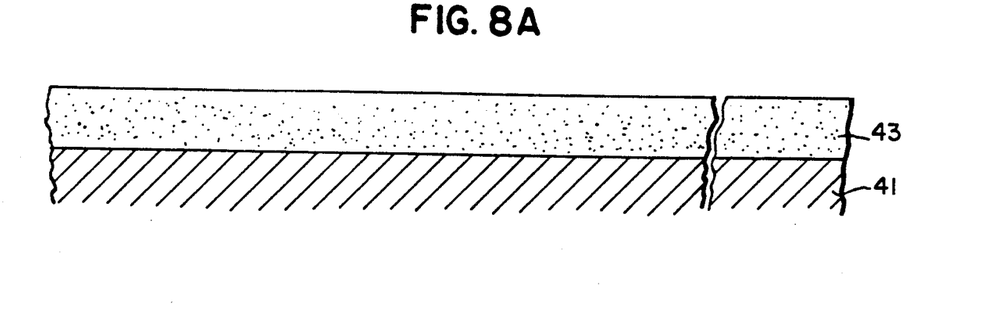
FIGS. 8A-8E are representations of cross section views of a substrate undergoing a method for characterizing a photolithography process according to the present invention.

FIG. 8A shows a wafer substrate layer 41 coated with a layer of photoresist 43. In FIGS. 8A-8E, use of a positive photoresist such as Shipley AZ 1350J is depicted, however, the present invention is also suitable for the optimization of negative photoresist lithography processes. The wafer substrate layer 41 can be single crystalline silicon similar to that which makes up the bulk wafer, or preferably, it can be a layer of the same type of material upon which the element to be optimized would normally overlay in product wafers. For example, as the metal lines which interconnect the devices in the silicon generally overlay silicon dioxide, the wafer substrate layer 41 is preferably a layer of silicon dioxide when metal line elements are to be optimized. In a typical semiconductor line, one or more monitor wafers accompany a particular job lot through the line. By using a monitor wafer, the process engineer can ensure that the wafer substrate layer 41 is identical to that of the product wafers.

Figure 8B:
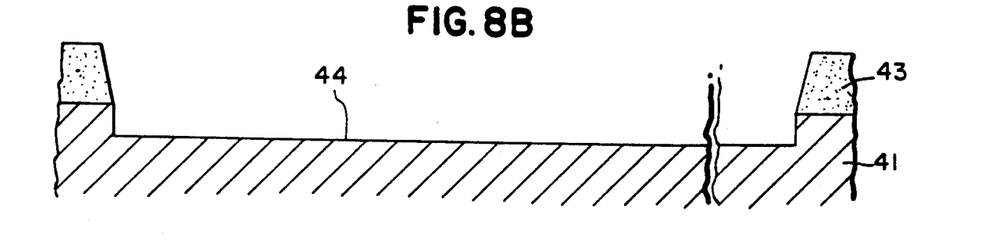

FIG. 8B shows a cross section of the wafer after the topography creating mask was utilized to expose the photoresist layer 43 and an etch process performed to etch a large via 44 into the wafer substrate layer 41. A typical via 44 depth would be on the order of one micron. The cross section shown corresponds to a scanning electron microscope (SEM) picture taken of a wafer cleaved along the x-direction 14 in rectangle 13 as shown in FIG. 1. As shown in FIG. 8B, the wafer substrate layer 41 is thicker than the depth of the large via 44. If a process step where a layer of a different reflectivity was revealed by the etching process in the product wafer was emulated, wafer substrate layer 41 thinner than the depth of the via would be deposited over the different reflectivity material to be revealed.

Alternatively, instead of etching large via 44 down into the wafer substrate layer 41, an alternate topography creating step is to form a mesa higher than the field areas on the substrate layer. A typical lift-off process could be used to deposit a large pad of material on the substrate. This large pad could be of a different material with a different reflectivity than the wafer substrate layer 41, or it could be of the same material. The mesa could also be formed by masking the portion of the wafer substrate layer 41 where the mesa is to be formed and substractively etching all the field areas around it.

Figure 8C:
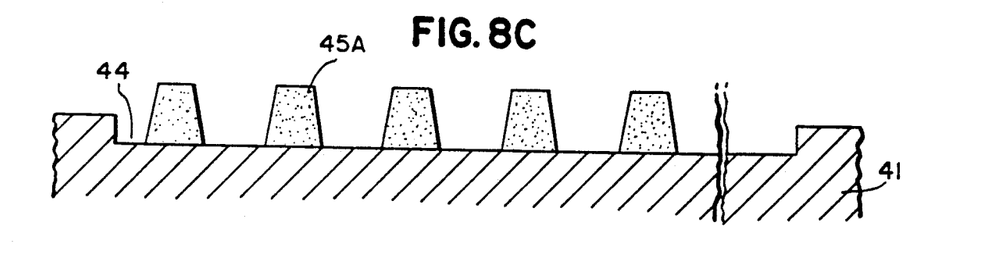

After the topography has been created in the wafer substrate layer 41, the excess resist 43 is removed. A second layer of photoresist is applied and lithographically patterned with subsets of fine elements 45A, 45B, 45C with the periodicity definition mask. The second lithography step can be performed by the same lithography tool as performed the first topography creating step, or by a different tool to assess overlay characteristics from tool-to-tool. FIG. 8C depicts a cross section of fine elements 45A, two micron wide lines separated by two micron wide spaces situated at the bottom of the large via 44. In this cross section, the lines 45A show good definition, resist slope, etc. A scanning electron microscope would be used to evaluate the image transfer and resist height.

Figure 8D:
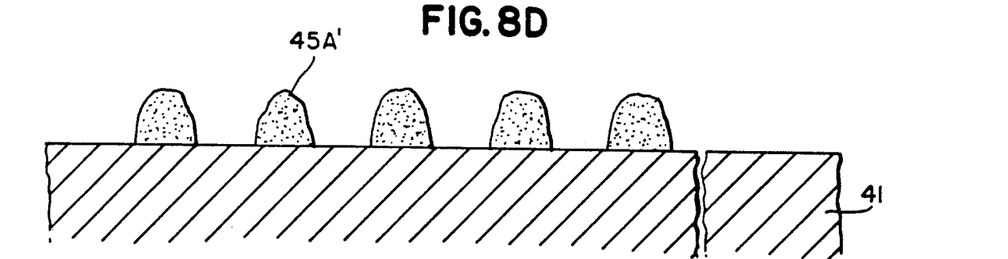

In FIG. 8D, a cross section of the same subset of fine lines 45A is shown as shown in FIG. 8c, however, in this FIG. they are depicted on the wafer substrate layer 41 in an area where the via 44 has not been etched, i.e., on an area 1 micron higher than in FIG. 8C. The lines 45A' are poorly defined, simulating a situation where the lithography tool has an extremely poor depth of focus.

Figure 8E:
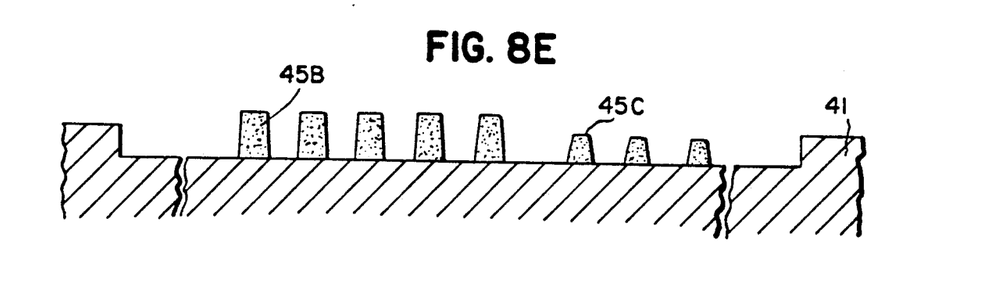

FIG. 8E depicts a particularly useful element of the present invention. All lithography tools have an associated impulse response or spread function which is the product of a complex set of selectable variables. The periodicity definition mask is designed so that a simple measurement of height will allow the impulse response to be derived. If the impulse response is 100%, the entire thickness of the photoresist layer will be maintained when the fine elements 45B are exposed and developed. If the impulse response is less than 100%, the spillover will reduce the resist height of the exposed image of the fine elements 45C. Eventually, as the fine elements of the periodicity mask decrease further and further in size, no resist will remain on the wafer substrate layer 41 at all.

Figure 9A:
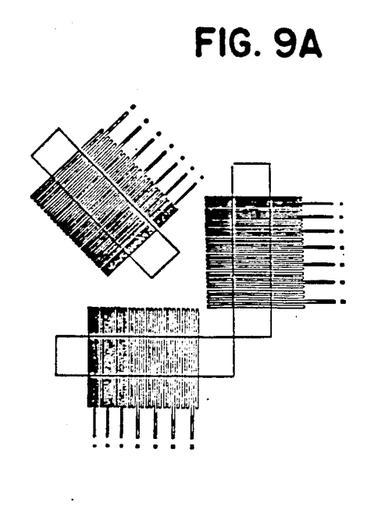
FIGS. 9A-9D are representations of top views of different embodiments of groups of fine elements of several different periodicity definition masks overlaying a group of large elements on complementary topography creating masks all designed according to the principles of the present invention.

FIGS. 9A through 9D depict top view representations of the other embodiments of the mask set of the present invention. FIG. 9A shows a topography creating mask and a periodicity definition mask with the angular elements situated between the elements along the x-direction and y-direction. This embodiment would be less preferred as the fine elements of the three sets are not quite as close in proximity to one another than those embodiments portrayed above.

Figure 9B:
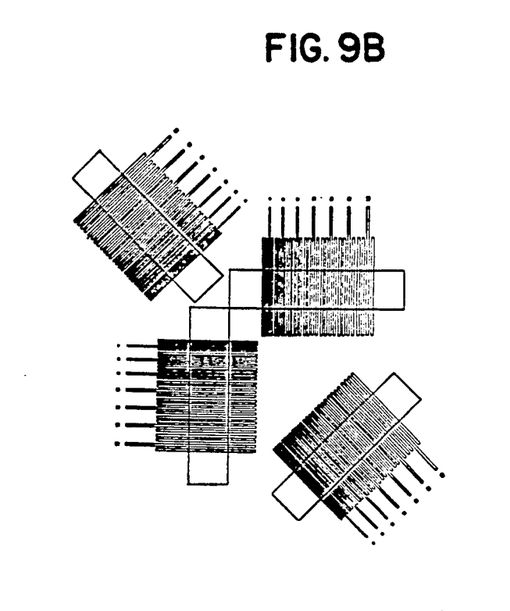

FIG. 9B depicts the addition of the fourth element positioned along the line 45 degrees from the x-direction, but also orthogonal to the line along which the third element is situated. This embodiment might have a slight advantage over the embodiments presented above as the addition of the fourth element provides some additional information. Obviously, further elements can be added to the basic three elements, however, the point of diminishing returns would be reached rather quickly.

Figure 9C:
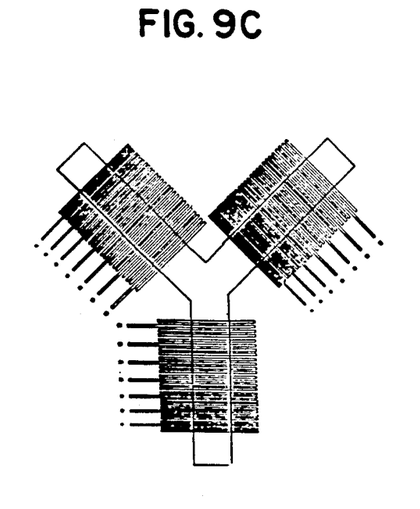

FIG. 9C illustrates two variations from the preferred embodiment presented above. First, it depicts a topography creating mask where three elements have been joined together. Second, it shows that the first, second and third elements of the masks do not have to be aligned parallel to the x-direction, y-direction, and some angle not equal to 90 degrees to the x-direction. Here the first element is aligned along a line 45 degrees from the x-direction, the second element is aligned 90 degrees from the first element along a line 45 degrees from the x-direction, and the third element is aligned along the y-direction. Because the first and second elements are at 45 degree angles, it is relatively easy to separate out the x-direction or y-direction effects.

Figure 9D:
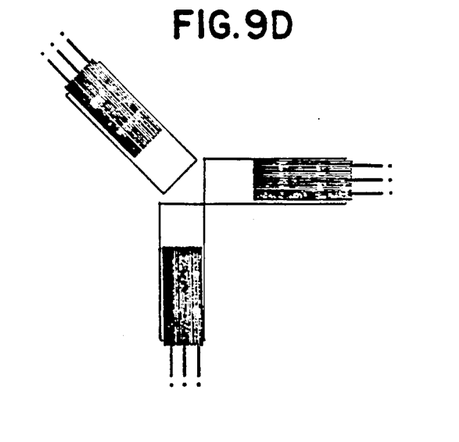

FIG. 9D shows the fine elements in the periodicity definition masks rotated at 90 degrees from the examples above. In this mask set, both the fine elements and the large elements on which they are placed are parallel to the same x-direction, y-direction, or angular direction.

Critical to the success of micron and submicron lithography is the extraordinarily accurate transfer of the pattern from a lithographic mask onto the photoresist coated wafer. There are a multitude of tool dependent parameters which should be fully characterized to optimize the lithography process. In the past, the full optical characterization of an imaging system has been delegated to optical laboratories and complex computer systems. Even so, these prior methods do not permit a complete measurement of the image transfer system over increasingly finer lithographic lines or over higher topographies on the substrate, as does the present invention.

For optical stepper tools, the basic performance is limited by the wavelengths of light used, the precision of the lens system and the uniformity and coherence of the illumination source. These characteristics will, in large part, determine the resolution, depth of focus and exposed field sizes of which a particular stepper tool is capable. As modern semiconductor technologies are producing topographies which are increasingly severe, good depth of focus is necessary to fully resolve fine elements at different heights on the substrate. Also, as the integration of circuits on semiconductor chips increases, so does the total chip area, demanding a large exposed field size.

There are two types of x-ray lithographic tools, synchrotron tools which generate x-ray radiation from the changing radius of curvature of megavolt electron beams, and emitter type tools which derive x-ray radiation from emission from a target acted on by primary accelerated electrons. Characteristics which determine the capabilities of a particular x-ray lithography tool include the flux uniformity across the field, the field size, the wavelengths of x-rays used, total dosage levels, hard versus soft x-rays and heating effects on the x-ray masks.

Electron beam lithographic beam tools pattern the photoresist layer on the wafer either by scanning across the wafer with a constant size electron beam, or by imaging of a small set of small rectangles to form a geometric area. While slow, electron beams tools offer great flexibility in that a physical mask need not be manufactured.

Because of the number of parameters affecting accurate image transfer and the complexity of their interrelationships, the utility of the present invention in quickly evaluating a photolithography process and identifying which parameters must be corrected can save several weeks to months of process development time.

Many of the parameters discussed above which affect accurate transfer of the mask pattern to the photoresist coated substrate are quantified by taking SEM photographs at selected sites across the wafer. There are commercially available SEMs such as the Hitachi Model No. S-806 which allow the process engineer to take SEM measurements across an entire semiconductor wafer without the tedious task of cleaving the wafer for cross sections. This is certainly a preferred method of collecting the SEM data.

Much of the information in which a process engineer is interested is collected by selecting a number of chip sites across the wafer from both the center of the wafer and the periphery. Parameters such as process characteristics related to the resist system and developer, uniformity of various imaging tool characteristics across the wafer, as well as those characteristics related to the overlay capabilities from tool-to-tool, are studied by comparing the resist heights and resolution at selected chip sites. As discussed above, the present invention is also used to form an experimental matrix across the wafer where one process parameter is varied in the vertical direction and a second process parameter is varied in the horizontal direction. In this case, more SEM photographs are taken per wafer, and their distribution is selected according to the axes of the experimental matrix.

Some of the information in which the engineer is interested is also collected within a particular chip. Parameters such as the uniformity and coherence of the radiation source are studied by comparing groups of fine elements at the outside edges of the chip to those near the center. If they differ significantly, there is a problem with the lithography tool. The use of fine elements placed along or orthogonal and angular directions allows the optics of the tool to be evaluated. Although most elements in product chips are placed in the vertical or horizontal directions, without the angular elements, it is often difficult to establish the exact defect in the lens system. Having the angular fine elements at a 45 degree angle is particularly useful, since those elements have equal X and Y components making it relatively easy to separate out the effects of the vertical or horizontal deficiencies in the lithography tool optics.

The use of the present invention to characterize the impulse response, contract ratio, and optical transfer function as shown in FIG. 8E, deserves further explanation. For an image to be formed in the photoresist, not only should the geometric relationships from the mask be accurately transferred, but also the light beams in the areas to be exposed and developed should be at a maximum, followed by a transition to "no light" in those areas where the full resist layer is to be retained. While ideally the contrast ratio is (Imax−Imin)/(Imax+Imin) is 100% between exposed and nonexposed areas, in practice a "spillover" of radiance occurs from the exposed areas to the dark areas. The curve expressing the lens capability of transferring the images is called the optical transfer function.

In the present invention, like the impulse response discussed above, the contrast ratio is calculated by the height of the resist layer remaining in decreasing size of the fine elements. The optical transfer function is derived from the contrast ratio calculated at various locations on the chip site.

To be useful in transferring a particular sized image, the lithography must maintain a contrast ratio of at least 60% between the high light areas and the dark areas. Due to diffraction effects at the edges of the images, the overall intensity of radiation is decreased, particularly for very small elements, spreading the radiation into neighboring dark areas. This diffraction effect results in higher exposure times for small geometries, in addition to the partial exposure of photoresist in the dark areas. In general, the higher the periodicity, i.e., the smaller the element, the poorer the optical transfer function will be.

Those skilled in the photolithography art recognize that most electron beam imaging tools do not utilize a lithography mask as such. At most, such tools use a small set of rectangular shapes to accurately define the beam width, particularly at the corners of rectangular elements. Nonetheless, the principles of the present invention can be practiced through the method portrayed in FIGS. 8A–8E. The topography and fine line element patterns will simply be stored in the electron beam imaging tool memory, rather than being physically embodied in a lithography mask.

While the invention has been described with respect to particular embodiments above, it would be understood by those skilled in the art that modifications may be made without departing from the spirit and scope of the present invention. For example, although only a single topography creating mask or step was described above, multiply stepped vias or a combination of vias and mesas could be formed on the wafer substrate layer. These embodiments are for purpose of example and illustration only and are not to be taken to limit the scope of the invention narrower than the scope of the appended claims.

We claim:

1. A method for optimizing a lithography process performed by a lithography tool on a substrate comprising the steps of:

depositing a layer of photoresist material on said substrate;

exposing at least a selected area of said photoresist material in a periodic pattern of fine elements on the same order as a critical element in said lithography process with said lithography tool in a single exposure step, said selected area substantially afield area of said lithography tool, said fine elements arranged in groups of at least three sets, each group having a first set of fine elements positioned along a line parallel to a first direction, a second set of fine elements positioned along a line parallel to a second direction, said second direction at a 90 degree angle from said first direction, and a third set of fine elements positioned along a line parallel to a third direction, said third direction at an angle other than 90 degrees from said first direction, each respective set of fine elements oriented in an orthogonal or a parallel direction to the respective line said set of fine elements is positioned along, said pattern of fine elements in said photoresist layer representative of the ability of said lithography tool to accurately transfer an image of said critical element within said selected area and, examining said fine elements to determine whether any changes in lithography process parameters are necessary to accurately transfer an image of said critical element within said selected area.

2. The method as recited in claim 1 further comprising the following steps, which occur before the steps recited in claim 1:

depositing a layer of photoresist material on said substrate;

exposing at least a selected area of said substrate in a pattern of large elements for creating topography with a lithographic tool said large elements arranged in groups of at least three elements, each group having a first large element positioned along a line parallel to said first direction, a second large element positioned along a line parallel to said second direction and a third large element positioned along a line parallel to said third direction;

performing a topography creating step; and said patter of large elements being formed before said pattern of fine elements, said group in said patterns being spaced from one another such that upon superposition of said fine elements upon said large elements, each group of a substantial number of groups of fine elements if aligned with a respective group of large elements so that depth of focus and substrate reflection effects may be studied.

3. The method as recited in claim 2 wherein the number of groups of fine elements is equal to the number of groups of large elements.

4. The method as recited in claim 1 wherein said first direction is an x-direction, said second direction is a y-direction, and said third direction is at an angle 45 degrees from the x-direction and, wherein each group of large elements comprises three rectangles, the first rectangle positioned with its long axis parallel to the x-direction, the second rectangle positioned with its long axis parallel to the y-direction and the third rectangle positioned with its long axis parallel to said third direction.

5. The method as recited in claim 4 wherein each group of fine elements comprises three sets of lines arranged in a periodic pattern, the first set positioned so that each line is in a direction orthogonal to the x-direction, the second set positioned so that each line is in a direction orthogonal to the y-direction and the third set positioned so that each line is orthogonal to said third direction.

6. The method as recited in claim 5 wherein each set of lines is arranged in a plurality of subsets, each subset contains a plurality of lines with an identical width and spaced at an identical spacing, each subset having a different width and spacing from any other subset, one line of each subset being longer than other lines of the subset so that proximity effects may be studied.

7. The method as recited in claim 1 wherein said exposing step is repeated in a second selected area of said photoresist material at different lithography process parameters so that a range of lithography parameters may be examined.

8. The method as recited in claim 1 wherein said exposing step is repeated a plurality of times in a plurality of selected areas of said photoresist material such that a first lithography process parameter is varied in a vertical direction across said substrate and a second lithography process parameter is varied in a horizontal direction across said substrate to form an experimental matrix of said first and second lithography process parameters to be examined in said examining step.

9. The method as recited in claim 6 which further comprises the step of measuring the height of said photoresist in said plurality of subsets to determined the impulse response, contrast ratio or optical transfer function of said lithography process.

10. The method as recited in claim 2 wherein said exposing step for said periodic pattern of fine elements is carried out in a different lithography tool than the lithography tool used to perform said exposing step for said pattern of large elements.

11. The method as recited in claim 2 wherein the topography creating step comprises the step of etching said substrate to leave depressions in said substrate where said large elements were exposed.

12. The method as recited in claim 2 wherein the topography creating step comprises the step of forming mesas where said large elements were exposed.

13. The method as recited in claim 1 wherein the mesa is formed of a different material than the substrate.

14. The method as recited in claim 1 wherein the substrate has a top layer composed of the same material as a layer which said critical element is be defined over in a product substrate.

15. A substrate used for optimizing a lithography process comprising:
- a first pattern of topography elements arranged in groups over a selected area of said substrate each group having a first topography element positioned along a line parallel to a first direction, a second topography element positioned along a line parallel to a second direction at a 90 degree angle from said first direction, and a third topographic element positioned along a line parallel to a third direction, said third direction at an angle not equal to 90 degrees from said first direction; and
- a second pattern of fine photoresist elements disposed in a periodic pattern over said first plurality of topographic elements in said preselected area, said fine photoresist elements arranged in groups, each group having a first set of fine photoresist elements positioned along a line parallel to said first direction, a second set of fine photoresist elements positioned along a line parallel to said second direction, and a third set of fine photoresist elements positioned along a line parallel to said third direction, said second pattern being formed in a single exposure step, said selected area substantially a field area of a lithography tool, and,
- said groups in said first and second patterns being spaced from one another such that upon superposition of said fine elements upon said large elements, each group of large elements is aligned with a respective group of fine elements.

16. The substrate as recited in claim 15 wherein said first direction is the x-direction, said second direction is the y-direction and said third direction is 45 degrees from the x-direction; and
- wherein each group of fine photoresist elements comprises three sets of photoresist lines arranged in a periodic pattern, the first set positioned so that each photoresist line is in a direction orthogonal to the x-direction, the second set positioned so that each line is in a direction orthogonal to the y-direction and the third set positioned so that each line is orthogonal to said third direction.

17. The substrate as recited in claim 15 wherein said topographic elements are large vias etched into said substrate.

18. The substrate as recited in claim 15 wherein said topographic elements are large mesas formed on said substrate.

* * * * *